United States Patent
Wu et al.

(10) Patent No.: US 12,431,043 B2
(45) Date of Patent: Sep. 30, 2025

(54) HEAT SPREADING SUBSTRATE FOR A DISPLAY

(71) Applicant: Hewlett-Packard Development Company, L.P., Spring, TX (US)

(72) Inventors: Kuan-Ting Wu, Taipei (TW); Hsing-Hung Hsieh, Taipei (TW); Chi Hao Chang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 465 days.

(21) Appl. No.: 17/911,575

(22) PCT Filed: Apr. 3, 2020

(86) PCT No.: PCT/US2020/026510
§ 371 (c)(1),
(2) Date: Sep. 14, 2022

(87) PCT Pub. No.: WO2021/201876
PCT Pub. Date: Oct. 7, 2021

(65) Prior Publication Data
US 2023/0112533 A1    Apr. 13, 2023

(51) Int. Cl.
*G09F 9/33* (2006.01)
*H01L 23/373* (2006.01)
*H10K 50/87* (2023.01)
*H10K 59/80* (2023.01)
*H10K 71/00* (2023.01)
*H10K 77/10* (2023.01)
(Continued)

(52) U.S. Cl.
CPC .......... *G09F 9/335* (2021.05); *H01L 23/3733* (2013.01); *H01L 23/3735* (2013.01); *H10K 50/87* (2023.02); *H10K 59/8794* (2023.02); *H10K 71/00* (2023.02); *H10K 77/111* (2023.02); *H10K 85/221* (2023.02); *H10K 2102/311* (2023.02); *H10K 2102/331* (2023.02)

(58) Field of Classification Search
CPC . G09F 9/335; H01L 23/3733; H01L 23/3735; H01L 23/373; H10K 50/87; H10K 59/8794; H10K 71/00; H10K 77/111; H10K 85/221; H10K 2102/311; H10K 2102/331; Y02E 10/549; B82Y 30/00
See application file for complete search history.

(56) References Cited

U.S. PATENT DOCUMENTS 5,690,837 A    11/1997  Nakaso et al.
8,957,577 B2    2/2015  Lynch et al.
9,374,932 B2    6/2016  Hwang
(Continued)

FOREIGN PATENT DOCUMENTS

EP         2462624 B1    5/2018
KR   10-2016-0050815 A   5/2016

*Primary Examiner* — J. E. Schoenholtz
(74) *Attorney, Agent, or Firm* — Shook, Hardy & Bacon L.L.P.

(57) ABSTRACT

The present disclosure is drawn to displays for electronic devices. In one example, the display includes a light emitting layer with an organic light emitting element. A porous substrate can be attached to the light emitting layer, wherein the porous substrate is flexible and spreads heat generated by the light emitting layer. A cover layer can be attached to a surface of the porous substrate opposite the light emitting layer.

22 Claims, 6 Drawing Sheets

(51) Int. Cl.
  *H10K 85/20* (2023.01)
  *H10K 102/00* (2023.01)

(56) References Cited

U.S. PATENT DOCUMENTS

| | | |
|---|---|---|
| 9,574,290 B2 | 2/2017 | Roberts et al. |
| 10,130,002 B2 | 11/2018 | Hwang |
| 10,254,574 B2 | 4/2019 | Tokuda |
| 2002/0053871 A1 | 5/2002 | Seo |
| 2005/0068738 A1* | 3/2005 | Kim .................. H10K 59/8794 |
| | | 257/E23.112 |
| 2018/0162098 A1* | 6/2018 | Joo ......................... B32B 9/007 |
| 2019/0221782 A1* | 7/2019 | Sun ......................... H10K 59/65 |
| 2020/0176705 A1* | 6/2020 | Lee ....................... G06F 1/1643 |
| 2020/0194710 A1* | 6/2020 | Zhao ...................... H10K 50/87 |
| 2022/0097353 A1* | 3/2022 | Nakanishi ............ H05K 9/0096 |

\* cited by examiner

HEAT SPREADING SUBSTRATE FOR A DISPLAY

BACKGROUND

Modern electronic devices increasingly use screens or displays as a component. Displays are useful for outputting information to a user. Displays can be built using different types of technology. For example, a display can be a cathode ray tube (CRT) display, a liquid crystal display (LCD), a plasma display, a light emitting diode (LED) display, or an electroluminescent display. Display technologies typically use some type of light to display images or text. Prolong display of a particular image or text can lead to image burn in. Image burn in can occur in any type of display technology. Displays can allow crack or break when the display is subjected to impact from a physical shock.

DETAILED DESCRIPTION

Figure 1:
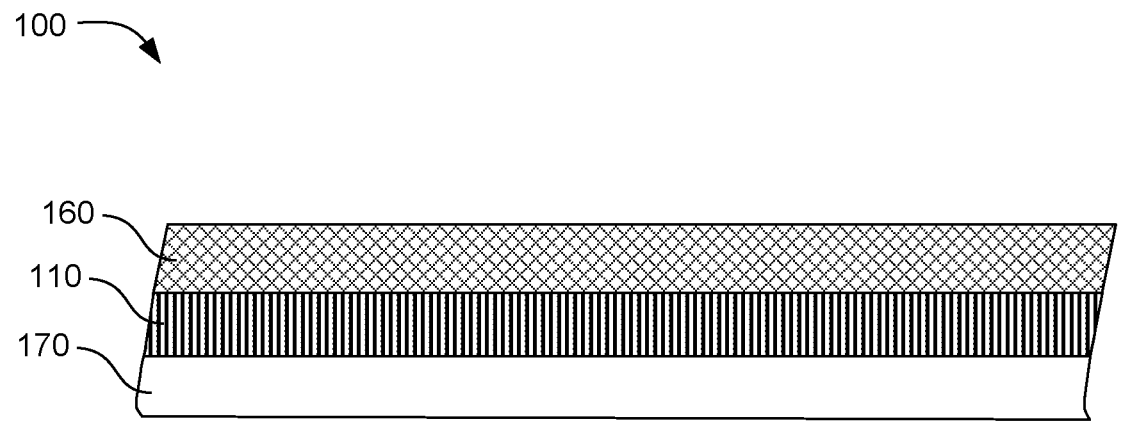
FIG. 1 is a cross-sectional view illustrating an example display with a heat spreading substrate and a cover for an electronic device in accordance with the present disclosure.

The present disclosure describes a porous heat spreading cushion layer for a display to resolve image sticking on the display and to provide a cushioning layer for the display. The display may be any type of display including an organic light emitting diode (OLED) display. OLED displays may be susceptible to damage due to image sticking. Image sticking or image retention can be in the form of temporary or permanent damage due to image sticking induced by thermal burn-in. The display can generate heat due to the emissions of light used by the display. When a given region or pixel of the display is left on one image, color, or text for too long image sticking can result due to the thermal burn-in. The porous heat spreading cushion layer can be placed adjacent to the display to absorb and spread the heat generated by the display to prevent permanent image sticking or thermal burn-in. The porous heat spreading cushion layer can also provide a physical cushion to the display and can absorb impact energy due to physical shock caused by dropping the device or another such impact.

In one example, a display for an electronic device can include a light emitting layer with an organic light emitting element. Heat generated by the light emitting layer can be spread to a porous substrate attached to the light emitting layer, the porous substrate can be flexible. A cover layer can be attached to a surface of the porous substrate layer opposite the light emitting layer. An adhesive can be used for adhering the porous substrate to the light emitting layer. The adhesive can spread heat generated by the light emitting layer which is transferred to the porous substrate. A first electroless copper coating can be positioned between the porous substrate and the light emitting layer. A second electroless copper coating can be positioned between the porous substrate and the cover layer. The first and the second copper coatings independently can have an average thickness from about 0.5 µm to about 10 µm thick. A carbon nanotube coating can be positioned between the porous substrate and the cover layer. The carbon nanotube coating can spread heat from the porous substrate. The porous substrate can include a polymeric material having a thickness from about 10 µm to about 0.7 mm. The polymeric material can include polyurethane, polyethylene terephthalate (PET), polyester, polyethylene naphthalate (PEN), polycarbonate (PC), polyethersulfone (PES), polycyclic olefin (PCO), e.g., a cyclic olefin polymer, polyimide (PI), polyacrylate, polystyrene, polymethyl methacrylate (PMMA), silicone rubber, a copolymer thereof, or a combination thereof. The polymeric material can be doped with from about 0.05 wt % to about 2 wt % graphene. The porous substrate can have a porosity of about 50 wt % to about 95 wt % by volume. The porous substrate can include a glass material having a thickness from about 0.1 mm to about 0.7 mm. The porous layer can also have a cushioning layer that absorbs impact energy.

In another example, an electronic device can include an electronic component and a display electronically integrated with the electronic component. The display can include a light emitting layer with an organic light emitting element. A porous substrate can be attached to the light emitting layer, where the porous substrate is flexible and spreads heat generated by the light emitting layer. A cover layer can be attached to a surface of the porous substrate layer opposite the light emitting layer. The electronic device can be a television, monitor, laptop, tablet computer, or smartphone. The organic light emitting element can be an organic light emitting diode (OLED).

In another example, a method of making a display for an electronic device, for example, includes forming a light emitting layer with an organic light emitting element. The method can further include adhering a porous substrate to the light emitting layer, wherein the porous substrate is flexible and spreads heat generated by the light emitting layer. The method can further include adhering a cover layer a surface of the porous substrate layer opposite the light emitting layer.

It is noted that when discussing the display, the electronic device, or the method of making the display, such discussions of one example are to be considered applicable to the other examples, whether or not they are explicitly discussed in the context of that example. Thus, in discussing a material or layer used for the porous substrate in the context of the display, such disclosure is also relevant to and directly supported in the context of the electronic device, the method of making the display, and vice versa.

Displays for Electronic Devices

The present disclosure describes displays for electronic devices that can include a porous substrate that can prevent image sticking due to thermal burn-in and that can provide cushioning during an impact. The display can be an organic light emitting diode (OLED) display. Alternatively, the display can be a cathode ray tube (CRT) display, a liquid crystal display (LCD), a plasma display, a light emitting diode (LED) display, or an electroluminescent display. The thermal burn-in can be caused by a display left on the same image for hours or days. Thermal burn-in may happen when a user plays the same video game for long amounts of time where the video game has images, such as a heads up display or a score board, that do not change or change or little over time. OLED screen may be susceptible to permanent thermal burn-in. The display may or may not be a touch screen display. The display may include a variety of materials such as plastics, glass, and/or metals.

FIG. 1 shows a cross-sectional view of a portion of example display 100 for an electronic device. The display includes a light emitting layer 160. The light emitting layer can have an organic light emitting element. In one example, the light emitting layer can include a plurality of light emitting elements. The light emitting element may be a component of an OLED display. The display may be an OLED or other type of display. The light emitting layer can be joined to a porous substrate 110. The porous substrate can have a porosity of about 50 wt % to about 95 wt % by volume. The porous substrate can be formed with pores that are voids or openings in the porous substrate. The pores may be filled with or include a second type of material. The porous substrate can be flexible. The flexibility, along with the pores allows the porous substrate to flex and cushion the light emitting layer during an impact. The cushioning may prevent the light emitting layer from breaking or cracking during an impact. The impact may be due to a physical shock such as dropping the display or another object impacting the display.

The pores on the porous substrate 110 can also absorb and spread heat. For example, the light emitting layer 160 may generate heat due to the light emitting element emitting light. The generated heat may be spread or transferred to the porous substrate. This transfer of heat prevents permanent damage to the light emitting layer such as permanent thermal burn-in. The transfer of heat to the porous substrate can also prevent temporary image retention. In one example, the porous substrate can include a glass material. The glass material can have a thickness from about 0.1 mm to about 0.7 mm. It may be appreciated that embodiments that include a glass material are not limited to a particular thickness.

In one example, the porous substrate 110 can include a polymeric material. The polymeric material can have a thickness from about 10 µm to about 0.7 mm. It may be appreciated that embodiments that include a polymeric material are not limited to a particular thickness. The polymeric material can include polyurethane, polyethylene terephthalate (PET), polyester, polyethylene naphthalate (PEN), polycarbonate (PC), polyethersulfone (PES), polycyclic olefin (PCO), e.g., a cyclic olefin polymer, polyimide (PI), polyacrylate, polystyrene, polymethyl methacrylate (PMMA), silicone rubber, a copolymer thereof, or a combination thereof. The polymeric material can be doped with from about 0.05 wt % to about 2 wt % graphene. The polymeric material can include a polyurethane foam and/or porous resins.

In one example, the display 100 include a cover layer 170. The cover layer can attach to a surface of the porous substrate 110 opposite the light emitting layer 160. The cover layer can be part of a housing or cover for the electronic device. For example, the electronic device can have a cover that protects and houses the various components of the electronic device such as printed circuit boards, a power source, wires, etc. The cover can include plastic, metal, or any other suitable material. The cover may cover all sides of the display with openings in the cover for the light emitting layer as well as other components of the display such as button for controlling the display.

Figure 2:
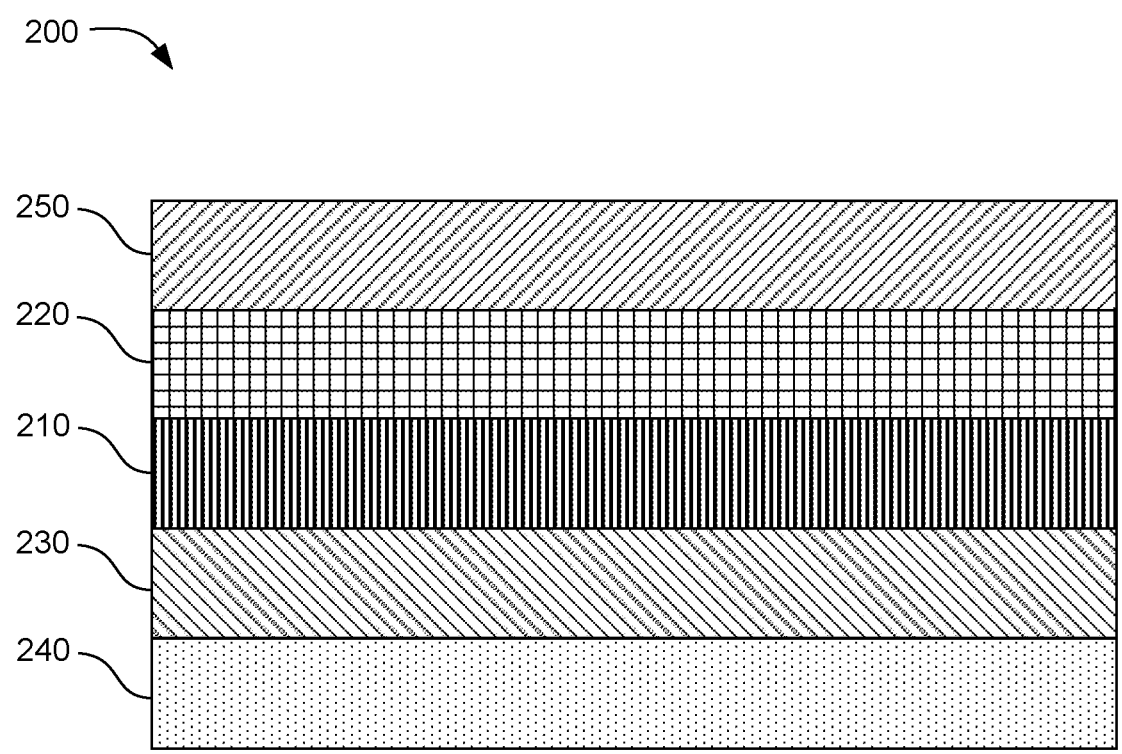
FIG. 2 is a cross-sectional view illustrating another example display with a heat spreading substrate for an electronic device in accordance with the present disclosure.

FIG. 2 shows a cross-section view of an example display 200 for an electronic device. The display can have features and capabilities such as those described for the display 100 of FIG. 1. The display in this example is depicted as including a porous substrate 210. The porous substrate may be the same as the porous substrate 110 of FIG. 1. The porous substrate can be coated with a first electroless copper coating 220 on a first surface of the porous substrate and coated on a second surface with a second electroless copper coating 230. For example, the first electroless copper coating may be on a first surface that is opposite of a second surface of the porous substrate that is attached to the second electroless copper coating. The first and second electroless copper coatings may independently have an average thickness from about 0.5 µm to about 10 µm thick. The first and second electroless copper coatings may be simultaneously deposited on the porous substrate or may be independently deposited on the porous substrate. The first and second electroless copper coatings can transfer heat to and from the porous substrate.

In one example, the electroless copper coatings are deposited using a roll to roll electroless copper plating technique. An electroless copper coating may be described as a thin film of copper deposited on a surface such as the porous substrate 210. An electroless coating may also be referred to as electroless plating. Electroless plating, also known as chemical or auto-catalytic plating, is a non-galvanic plating method that involves several simultaneous reactions in an aqueous solution, which occur without the use of external electrical power. It is mainly different from electroplating by not using external electrical power.

In one example, the display 200 can include an adhesive layer 250. The adhesive layer can include an adhesive that is employed for adhering the porous substrate 210 to a light emitting layer (not shown) of the display. The adhesive layer may be applied directly on a surface of the porous substrate or may be deposited on an intervening layer such as the first electroless copper coating 220. The adhesive layer may also serve to spread heat generated by a light emitting layer. The heat may be spread to the porous substrate. In one example, the adhesive layer can include a first material that can be butyl acrylate, hexyl acrylate, 2-ethylhexyl acrylate, acrylic-based adhesive, polycarbonate, polyester, silicone, or a combination thereof. The first material of the adhesive layer can be combined with about 0.1 wt % to about 15 wt % of graphene, carbon nanotube, aluminum powder, copper powder, silver powder, aluminum nitride, boron nitride, silicon carbide, or a combination thereof.

In one example, the display 200 can include a carbon nanotube coating 240. The carbon nanotube coating can be deposited on a surface of the porous substrate 210 or on an intervening layer such as the second electroless copper coating 230. The carbon nanotube coating can transfer heat away from the porous substrate and further assist the porous substrate in spreading the heat away from the light emitting layer to prevent image sticking. The heat may be spread from the porous substrate through the second electroless copper coating to the carbon nanotube coating. In one example, the carbon nanotube coating includes a first material that can be polyurethane, polyacrylic, polyester, elastomer, or a combination thereof. The first material of the carbon nanotube coating can be combined with about 0.3 wt % to about 30.0 wt % carbon nanotube powders.

Carbon nanotubes (CNTs) are tubes can be made of carbon with diameters typically measured in nanometers. Carbon nanotubes often refer to single-wall carbon nanotubes (SWCNTs) with diameters in the range of a nanometer. Single-wall carbon nanotubes are one of the allotropes of carbon, intermediate between fullerene cages and flat graphene. Carbon nanotubes also often refer to multi-wall carbon nanotubes (MWCNTs) consisting of nested single-wall carbon nanotubes. Carbon nanotubes can also refer to tubes with an undetermined carbon-wall structure and diameters less than 100 nanometers. Carbon nanotubes can exhibit electrical conductivity, tensile strength, and thermal conductivity that is due to nanostructure and strength of the bonds between carbon atoms. In addition, the carbon nanotubes can be chemically modified.

It may be appreciated that a display 200 may be formed with some or all of the layers depicted in FIG. 2. For example, the porous substrate 210 may or may not include the first or second electroless copper coating. Further, the porous substrate may not include the carbon nanotube coating or the adhesive layer.

Figure 3:
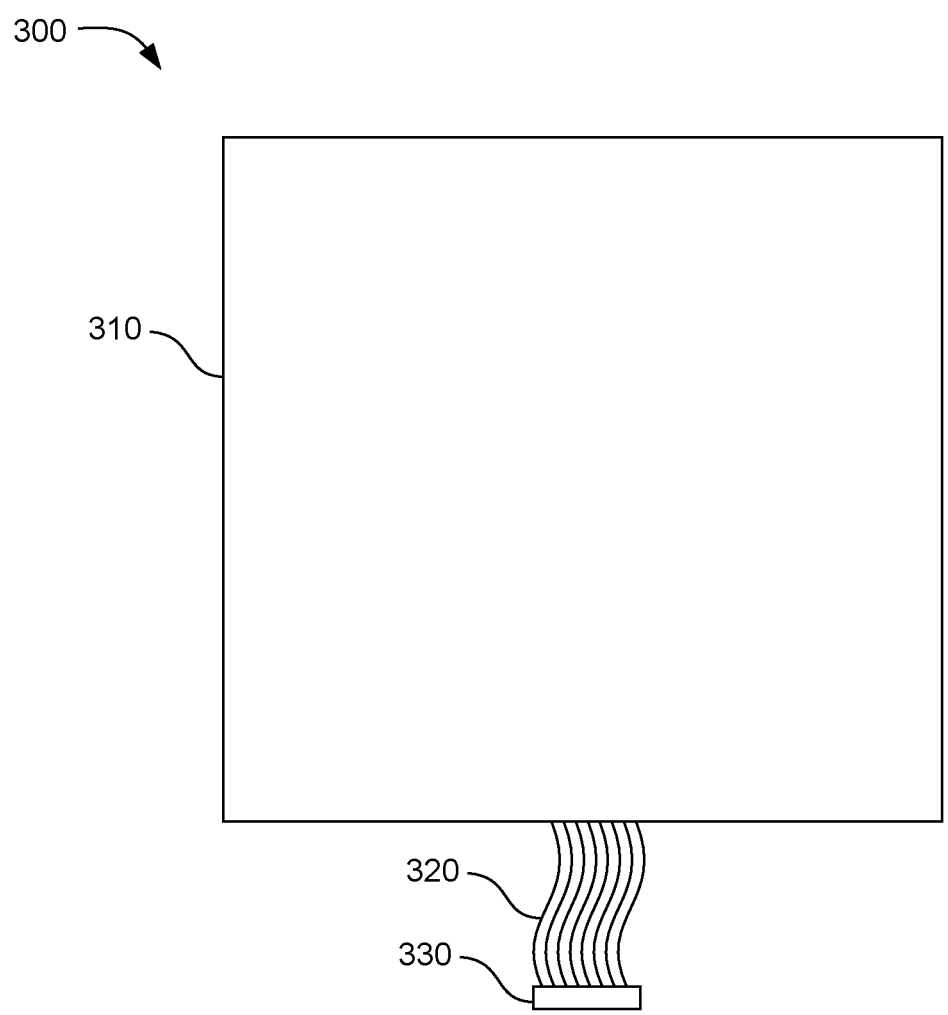
FIG. 3 is a top down view of an example display for an electronic device in accordance with the present disclosure.

FIG. 3 shows another example display 300 for an electronic device. FIG. 3 depicts a top view of the display and the depicted without a cover, housing, or bezel. The display may be connected to electronic components of the electronic device. The display may include wires 320 such as ribbon wires. The wires may connect to the light emitting elements or electrodes of the display. A wire harness 330 may connect the wires to display controller or display driver of the display. The electronic device associated with the display may be a television, monitor, laptop, tablet computer, or smartphone. The electronic device may have more than one display that may incorporate elements of the present technology.

In one example, the display 300 is an OLED display. An organic light-emitting diode (OLED or Organic LED), also known as an organic electroluminescent diode, is a light-emitting diode in which the emissive electroluminescent layer is a film of organic compound that emits light in response to an electric current. This organic layer is situated between two electrodes; typically, at least one of these electrodes is transparent. OLEDs are used to create digital displays in devices such as television screens, computer monitors, portable systems such as smartphones, handheld game consoles and PDAs.

There are two main families of OLED: those based on small molecules and those employing polymers. Adding mobile ions to an OLED creates a light-emitting electrochemical cell (LEC) which has a slightly different mode of operation. An OLED display can be driven with a passive-matrix (PMOLED) or active-matrix (AMOLED) control scheme. In the PMOLED scheme, individual rows (and lines) in the display may be controlled sequentially, one by one, whereas AMOLED control uses a thin-film transistor backplane to directly access and switch individual pixels on or off, allowing for higher resolution and larger display sizes.

An OLED display can work without a backlight because it emits visible light. Thus, it can display deep black levels and can be thinner and lighter than a liquid crystal display (LCD). In low ambient light conditions (such as a dark room), an OLED screen can achieve a higher contrast ratio than an LCD, regardless of whether the LCD uses cold cathode fluorescent lamps or an LED backlight. OLED displays are made in the same way as LCDs, but after TFT (for active matrix displays), addressable grid (for passive matrix displays) or ITO segment (for segment displays) formation, the display is coated with hole injection, transport and blocking layers, as well with electroluminescent material after the 2 first layers, after which ITO or metal may be applied again as a cathode and later the entire stack of materials is encapsulated. The TFT layer, addressable grid or ITO segments serve as or are connected to the anode, which may be made of ITO or metal.[7][8] OLEDs can be made flexible and transparent, with transparent displays being used in smartphones with optical fingerprint scanners and flexible displays being used in foldable smartphones.

The display 300 can also be a cathode ray tube (CRT) display, a liquid crystal display (LCD), a plasma display, a light emitting diode (LED) display, or an electroluminescent display.

As used herein, a layer that is referred to as being "on" a lower layer can be directly applied to the lower layer, or an intervening layer or multiple intervening layers can be located between the layer and the lower layer. Generally, the displays described herein can include a porous substrate, a light emitting layer, and a cover. Accordingly, a layer that is "on" a lower layer can be located further from the porous substrate. Thus, a "higher" layer applied "on" a "lower" layer may be located farther from the porous substrate and closer to a viewer viewing the cover from the outside.

It is noted that when discussing displays for electronic devices, the electronic devices themselves, or methods of making displays for electronic devices, such discussions can be considered applicable to one another whether or not they are explicitly discussed in the context of that example. Thus, for example, when discussing the materials used in the porous substrate in the context of one of the example displays, such disclosure is also relevant to and directly supported in the context of the electronic devices and/or methods, and vice versa. It is also understood that terms used herein will take on their ordinary meaning in the relevant technical field unless specified otherwise. In some instances, there are terms defined more specifically throughout or included at the end of the present disclosure, and thus, these terms are supplemented as having a meaning described herein.

Electronic Devices

A variety of electronic devices can be made with the displays described herein. In various examples, such electronic devices can include various electronic components enclosed by the cover. As used herein, "encloses" or "enclosed" when used with respect to the covers enclosing electronic components can include covers completely enclosing the electronic components or partially enclosing the electronic components. Many electronic devices include openings for charging ports, input/output ports, headphone ports, and so on. Accordingly, in some examples the cover can include openings for these purposes. Certain electronic components may be designed to be exposed through an opening in the cover, such as display screens, keyboard keys, buttons, track pads, fingerprint scanners, cameras, and so on. Accordingly, the covers described herein can include openings for these components. Other electronic components may be designed to be completely enclosed, such as motherboards, batteries, sim cards, wireless transceivers, memory storage drives, and so on. Additionally, in some examples a cover can be made up of two or more cover sections, and the cover sections can be assembled together with the electronic components to enclose the electronic components. As used herein, the term "cover" can refer to an individual cover section or panel, or collectively to the cover sections or panels that can be assembled together with electronic components to make the complete electronic device.

Methods of Making Displays for Electronic Devices

Figure 4:
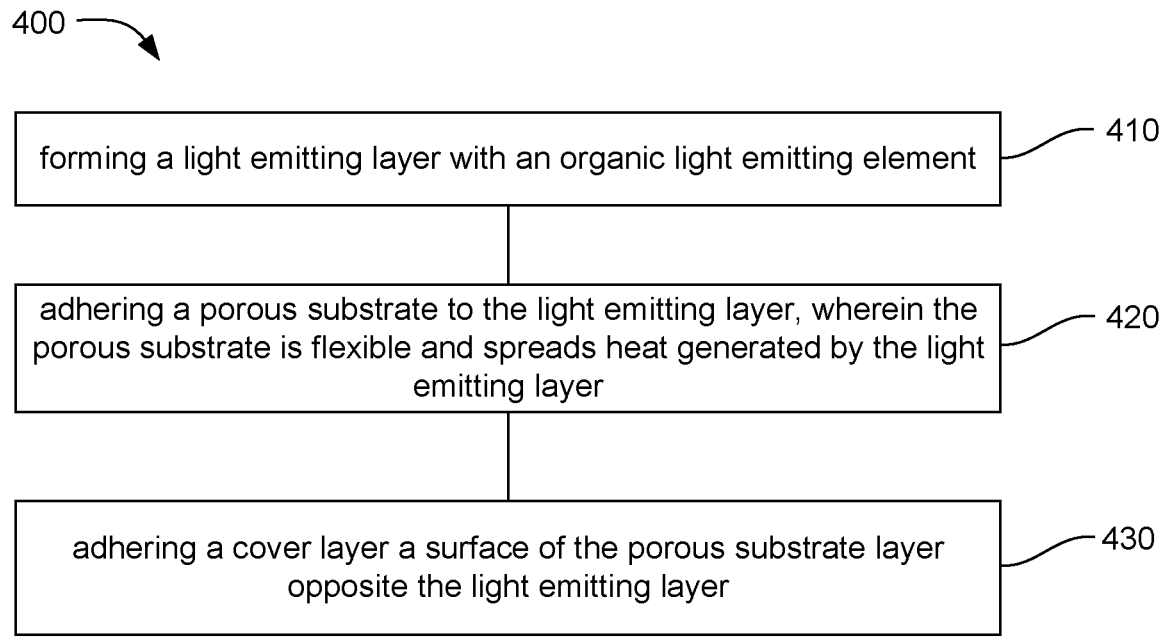
FIGS. 4-5 are flowcharts illustrating example methods of making a display for an electronic device in accordance with the present disclosure.

FIG. 4 is a flowchart illustrating an example method 400 of making a cover for an electronic device. The method includes forming 410 a light emitting layer with an organic light emitting element, adhering 420 a porous substrate to the light emitting layer, wherein the porous substrate is flexible and spreads heat generated by the light emitting layer, and adhering 430 a cover layer a surface of the porous substrate layer opposite the light emitting layer.

Figure 5:
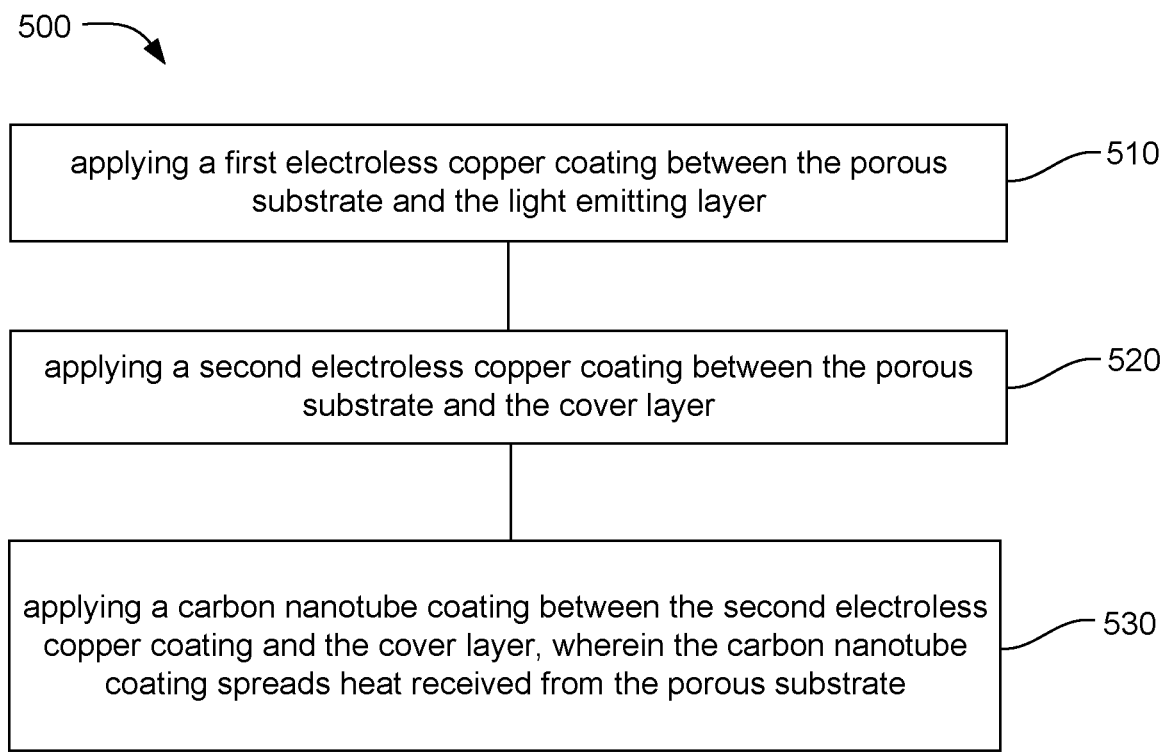

FIG. 5 is a flowchart illustrating an example method 500 of making a cover for an electronic device. The method 500 may be combined with the method 500 of FIG. 4. The method includes applying 510 a first electroless copper coating between the porous substrate and the light emitting layer, applying 520 a second electroless copper coating between the porous substrate and the cover layer, and applying 530 a carbon nanotube coating between the second electroless copper coating and the cover layer, wherein the carbon nanotube coating spreads heat received from the porous substrate.

Figure 6A:
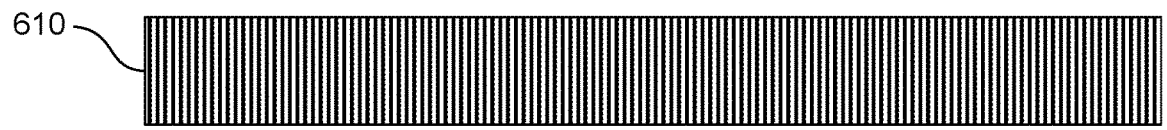
FIGS. 6A-6G are cross-sectional views showing another example method of making a display for an electronic device in accordance with the present disclosure.
Figure 6B:
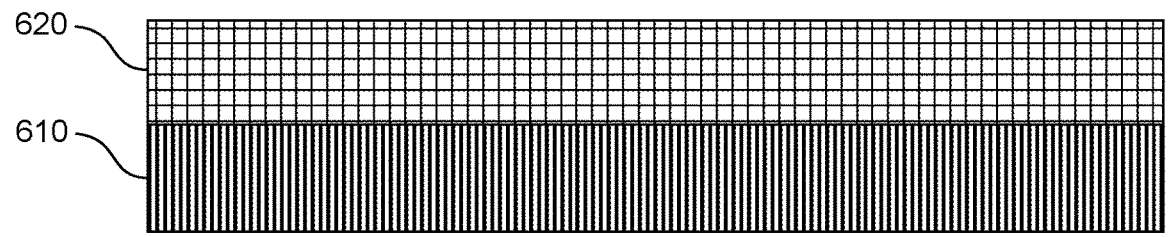
Figure 6C:
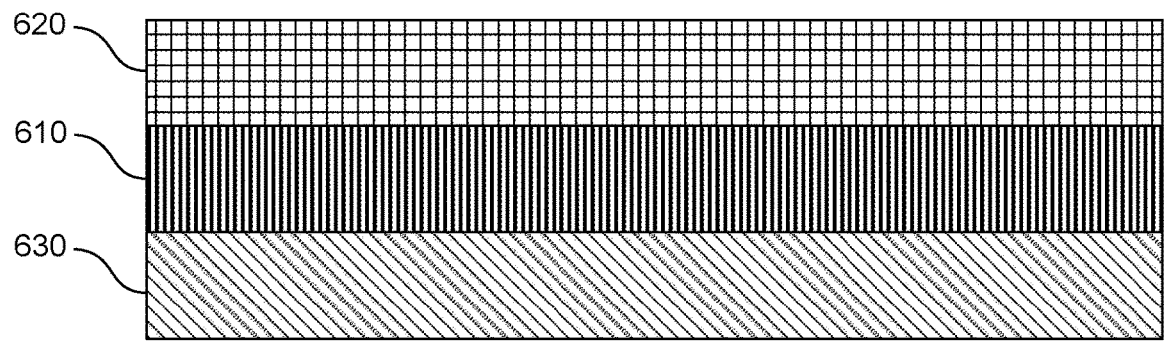
Figure 6D:
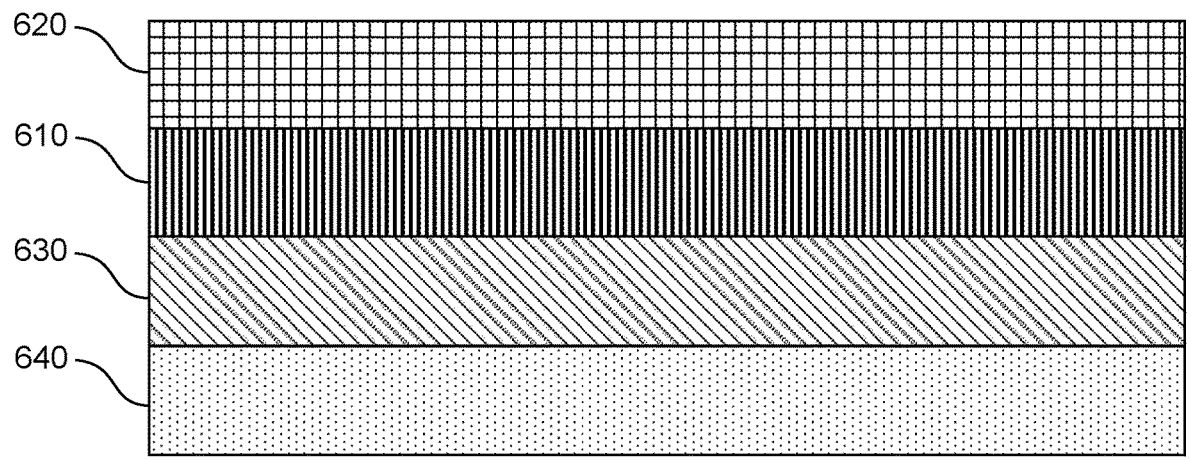
Figure 6E:
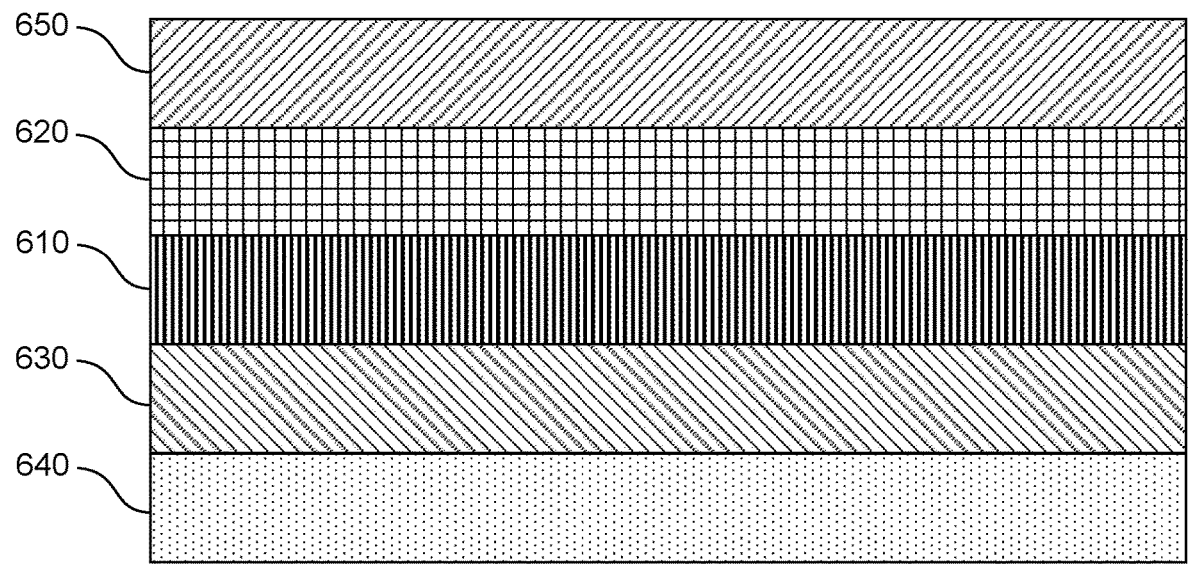
Figure 6F:
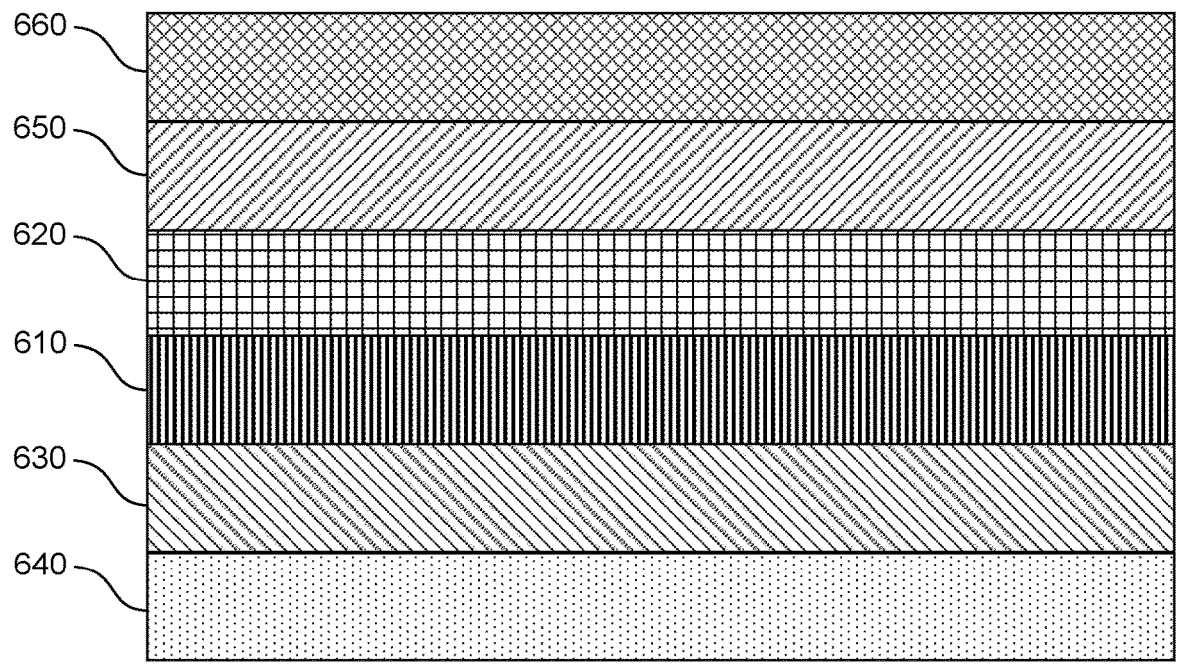
Figure 6G:
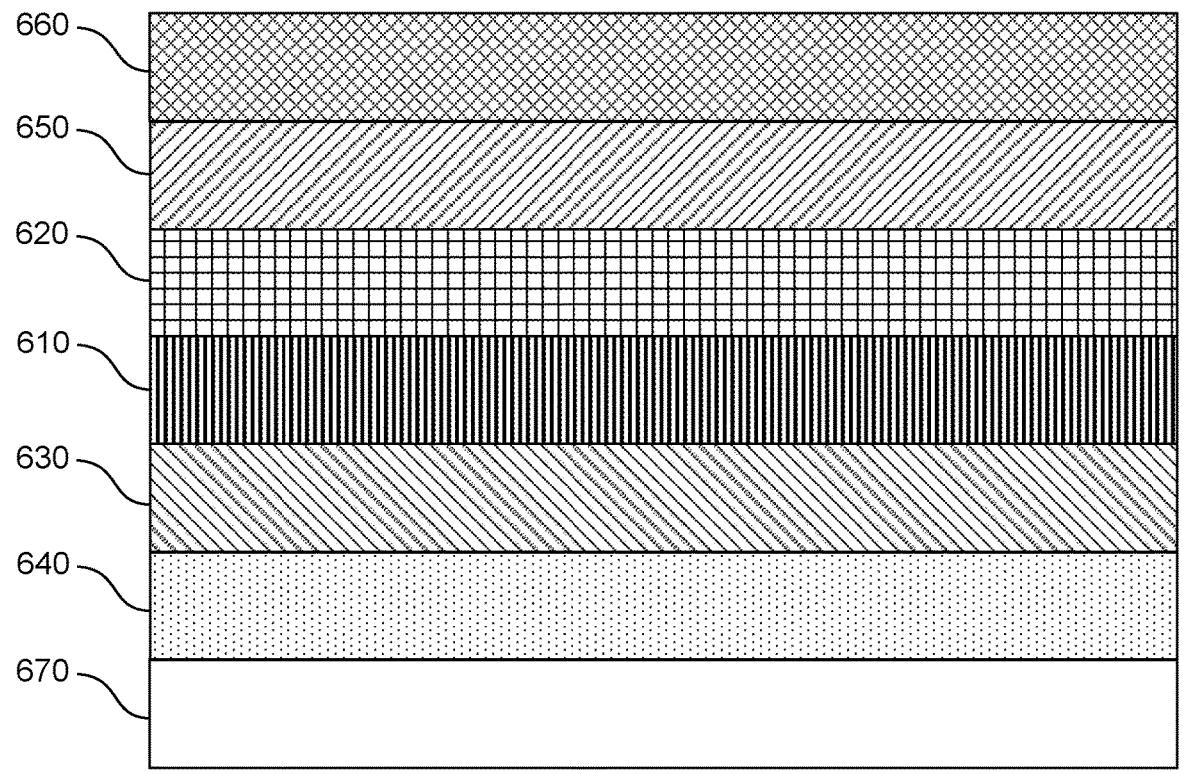

FIGS. 6A-6G show cross-sectional views illustrating another example method of making a display for an electronic device. In FIG. 6A, a porous substrate 610 is formed. In FIG. 6B, a first electroless copper coating 620 is deposited on a first surface of the porous substrate. In FIG. 6C, a second electroless copper coating 630 is deposited on a second surface of the porous substrate. The first and second electroless copper coatings can be deposited simultaneously. In FIG. 6D, a carbon nanotube coating 640 is deposited on the surface of the second electroless copper coating. In FIG. 6E, an adhesive layer 650 is deposited on a surface of the first electroless copper coating. In FIG. 6F a light emitting layer 660 is applied to the adhesive layer. In FIG. 6G, a cover layer 670 is applied to a surface of the carbon nanotube coating. It may be appreciated that the steps depicted in FIGS. 6A-6G can be carried out in the order described or may be carried out in a different order. Additionally, a display may not include every layer or coating depicted in FIGS. 6A-6G. For example, a display may not include the first and second electroless copper coatings or the carbon nanotube coating.

DEFINITIONS

It is noted that, as used in this specification and the appended claims, the singular forms "a," "an," and "the" include plural referents unless the content clearly dictates otherwise.

The term "about" as used herein, when referring to a numerical value or range, allows for a degree of variability in the value or range, for example, within 5% or other reasonable added range breadth of a stated value or of a stated limit of a range. The term "about" when modifying a numerical range is also understood to include the exact numerical value indicated, e.g., the range of about 1 wt % to about 5 wt % includes 1 wt % to 5 wt % as an explicitly supported sub-range.

The term "substrate" as used herein, is a term used in materials science to describe the base material on which processing is conducted to produce new film or layers of material such as deposited coatings. The substrate may be uppermost layer, a lowermost layer, or a layer therebetween, depending on the build. The substrate may also be for support and/or provide a function.

The term "display" as used herein, refers to a display device that is used for the presentation of visual information. The display may be incorporated in an electronic device. The electronic device may be connected to second electronic device such as a desktop computer such that the display presents information from the second electronic device.

As used herein, a plurality of items, structural elements, compositional elements, and/or materials may be presented in a common list for convenience. However, these lists can be construed as though the individual members of the list are individually identified as a separate and unique member. Thus, no individual member of such list is to be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and may be interpreted flexibly to include the numerical values explicitly recited as the limits of the range, and also to include all the individual numerical values or sub-ranges encompassed within that range as if individual numerical values and sub-ranges are explicitly recited. For example, a layer thickness from about 0.1 μm to about 0.5 μm may be interpreted to include the explicitly recited limits of 0.1 μm to 0.5 μm, and to include thicknesses such as about 0.1 μm and about 0.5 μm, as well as subranges such as about 0.2 μm to about 0.4 μm, about 0.2 μm to about 0.5 μm, about 0.1 μm to about 0.4 μm etc.

EXAMPLES

The following illustrates an example of the present disclosure. However, it is to be understood that the following is illustrative of the application of the principles of the present disclosure. Numerous modifications and alternative compositions, methods, and systems may be devised without departing from the spirit and scope of the present disclosure. The appended claims are intended to cover such modifications and arrangements.

Example 1

An example display for an electronic device is made as follows:
1) A porous substrate is made from a polymeric material.
2) The porous substrate has a porosity of about 50 wt % to about 95 wt % by volume.
3) A first electroless copper coating is formed on a first surface of the porous substrate using a roll to roll process.
4) A second electroless copper coating is formed on a second surface of the porous substrate using a roll to roll process. The second surface of the porous substrate is opposite of the first surface of the porous substrate.
5) A carbon nanotube coating is formed on a surface of the second electroless copper coating opposite a surface of the porous substrate. The carbon nanotube coating being formed with carbon nanotube powders.
6) A cover formed on a surface of the carbon nanotube coating on a surface opposite of the second electroless copper coating.
7) A light emitting layer including organic light emitting elements attached to a surface of the first electroless copper coating opposite a surface of the porous substrate using an adhesive.

Example 2

An example display for an electronic device is made as follows:
1) A porous substrate is made from a polymeric material.
2) The porous substrate has a porosity of about 50 wt % to about 95 wt % by volume.
3) A cover formed on a surface of the porous substrate.

4) A light emitting layer including organic light emitting elements attached to a surface of the porous substrate opposite a surface of the cover using an adhesive.

What is claimed is:

1. A display for an electronic device comprising:
    a light emitting layer with an organic light emitting element;
    a porous substrate attached to the light emitting layer, wherein the porous substrate is flexible and spreads heat generated by the light emitting layer; and
    a cover layer attached to a surface of the porous substrate opposite the light emitting layer; and
    a carbon nanotube coating between the porous substrate and the cover layer.

2. The display of claim 1, further comprising an adhesive adhering the porous substrate to the light emitting layer, wherein the adhesive spreads heat generated by the light emitting layer which is transferred to the porous substrate.

3. The display of claim 1, further comprising a first electroless copper coating positioned between the porous substrate and the light emitting layer; and a second electroless copper coating between the porous substrate and the cover layer, wherein the first and the second copper coatings independently have an average thickness from about 0.5 μm to about 10 μm thick.

4. The display of claim 1, wherein the carbon nanotube coating spreads heat from the porous substrate.

5. The display of claim 1, wherein the porous substrate includes a polymeric material having a thickness from about 10 μm to about 0.7 mm.

6. The display of claim 5, wherein the polymeric material includes polyurethane, polyethylene terephthalate (PET), polyester, polyethylene naphthalate (PEN), polycarbonate (PC), polyethersulfone (PES), polycyclic olefin (PCO), polyimide (PI), polyacrylate, polystyrene, polymethyl methacrylate (PMMA), silicone rubber, a copolymer thereof, or a combination thereof.

7. The display of claim 5, wherein the polymeric material is doped with from about 0.05 wt % to about 2 wt % graphene.

8. The display of claim 1, wherein the porous substrate has a porosity of about 50 wt % to about 95 wt % by volume.

9. The display of claim 1, wherein the porous substrate includes a glass material having a thickness from about 0.1 mm to about 0.7 mm.

10. The display of claim 1, wherein the porous layer is also a cushioning layer that absorbs impact energy.

11. An electronic device comprising:
    an electronic component; and
    a display electronically integrated with the electronic component, the display comprising:
        a light emitting layer with an organic light emitting element;
        a porous substrate attached to the light emitting layer, wherein the porous substrate is flexible and spreads heat generated by the light emitting layer; and
        a cover layer attached to a surface of the porous substrate layer opposite the light emitting layer; and
        a carbon nanotube coating between the porous substrate and the cover layer.

12. The electronic device of claim 11, wherein the electronic device is a television, monitor, laptop, tablet computer, or smartphone.

13. The electronic device of claim 11, wherein the organic light emitting element is an organic light emitting diode (OLED).

14. A method of making a display for an electronic device comprising:
    forming a light emitting layer with an organic light emitting element;
        adhering a porous substrate to the light emitting layer, wherein the porous substrate is flexible and spreads heat generated by the light emitting layer;
        applying a carbon nanotube coating on a surface of the porous substrate; and
        adhering a cover layer attached to a surface of the porous substrate layer opposite the light emitting layer.

15. The method of claim 14, further comprising:
    applying a first electroless copper coating between the porous substrate and the light emitting layer;
    applying a second electroless copper coating between the porous substrate and the cover layer; and
    applying a carbon nanotube coating between the second electroless copper coating and the cover layer, wherein the carbon nanotube coating spreads heat received from the porous substrate.

16. The display of claim 1, wherein the carbon nanotube coating includes a first material comprises polyurethane, polyacrylic, polyester, elastomer, or a combination thereof.

17. The display of claim 16, wherein the first material is combined with about 0.3 wt % to about 30.0 wt % carbon nanotube powders.

18. The electronic device of claim 11, wherein the carbon nanotube coating includes a first material comprises polyurethane, polyacrylic, polyester, elastomer, or a combination thereof.

19. The electronic device of claim 18, wherein the first material is combined with about 0.3 wt % to about 30.0 wt % carbon nanotube powders.

20. The method of claim 14, wherein the carbon nanotube coating includes a first material comprises polyurethane, polyacrylic, polyester, elastomer, or a combination thereof.

21. A display for an electronic device comprising:
    a light emitting layer with an organic light emitting element;
    a porous substrate attached to the light emitting layer, wherein the porous substrate is flexible and spreads heat generated by the light emitting layer, and wherein the porous substrate includes a polymeric material having a thickness from about 10 μm to about 0.7 mm; and
    a cover layer attached to a surface of the porous substrate opposite the light emitting layer.

22. A display for an electronic device comprising:
    a light emitting layer with an organic light emitting element;
    a porous substrate attached to the light emitting layer, wherein the porous substrate is flexible and spreads heat generated by the light emitting layer, and wherein the porous substrate includes a glass material having a thickness from about 0.1 mm to about 0.7 mm; and
    a cover layer attached to a surface of the porous substrate opposite the light emitting layer.

* * * * *